(12) United States Patent
Burrell et al.

(10) Patent No.: US 8,158,247 B2
(45) Date of Patent: Apr. 17, 2012

(54) POROUS LIGHT-EMITTING COMPOSITIONS

(75) Inventors: Anthony K. Burrell, Los Alamos, NM (US); Thomas Mark McCleskey, Los Alamos, NM (US); Quanxi Jia, Los Alamos, NM (US); Eve Bauer, Los Alamos, NM (US); Alexander H. Mueller, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 550 days.

(21) Appl. No.: 12/322,419

(22) Filed: Jan. 30, 2009

(65) Prior Publication Data

US 2009/0233080 A1 Sep. 17, 2009

Related U.S. Application Data

(60) Provisional application No. 61/063,154, filed on Jan. 30, 2008, provisional application No. 61/063,153, filed on Jan. 30, 2008.

(51) Int. Cl.
*B32B 3/12* (2006.01)
*B32B 3/00* (2006.01)
*C09K 11/08* (2006.01)
*C09K 11/77* (2006.01)

(52) U.S. Cl. ............... 428/312.6; 428/312.2; 428/312.8; 428/315.5; 428/338; 428/116; 252/301.4 R

(58) Field of Classification Search ........................ None
See application file for complete search history.

(56) References Cited

U.S. PATENT DOCUMENTS 5,313,485 A * 5/1994 Hamil et al. .................... 372/69
2004/0072106 A1 * 4/2004 Chua et al. .................... 430/320

OTHER PUBLICATIONS

Fan et al., "High Extraction Efficiency of Spontaneous Emission from Slabs of Photonic Crystals," Physical Review Letters, vol. 78 (Apr. 1997) pp. 3294-3297.
Lange, "Chemical Solution Routes to Single-Crystal Thin Films," Science, vol. 273 (Aug. 1996) pp. 903-909.
Schwartz, "Chemical Solution Deposition of Perovskite Thin Films," Chemistry of Materials, vol. 9 (Nov. 1997) pp. 2325-2340.

* cited by examiner

*Primary Examiner* — Ling Xu
(74) *Attorney, Agent, or Firm* — Bruce H. Cottrell; Samuel L. Borkowsky

(57) ABSTRACT

Light-emitting devices are prepared by coating a porous substrate using a polymer-assisted deposition process. Solutions of metal precursor and soluble polymers having binding properties for metal precursor were coated onto porous substrates. The coated substrates were heated at high temperatures under a suitable atmosphere. The result was a substrate with a conformal coating that did not substantially block the pores of the substrate.

6 Claims, 5 Drawing Sheets

POROUS LIGHT-EMITTING COMPOSITIONS

RELATED APPLICATIONS

This application claims the benefit of U.S. Provisional Application Ser. No. 61/063,154 entitled "Composite Phosphors Based on Coating Porous Substrates," filed Jan. 30, 2008, and U.S. Provisional Application Ser. No. 61/063,153 filed Jan. 30, 2008 entitled "Polymer-Assisted Deposition of Conformal Films on Porous Materials," both hereby incorporated by reference.

STATEMENT REGARDING FEDERAL RIGHTS

This invention was made with government support under Contract No. DE-AC52-06NA25396 awarded by the U.S. Department of Energy. The government has certain rights in the invention.

FIELD OF THE INVENTION

The present new light-emitting devices that result from conformal films on porous materials, in particular luminescent metal oxide films, and more particularly these luminescent metal oxide films deposited on porous alumina and silica structures resulting in composite phosphors or scintillators.

BACKGROUND OF THE INVENTION

Phosphors find applications in many Light Emitting Devices ("LED"). Thin films of phosphors are used in many imaging and LED applications from radiation detection to solid state lighting. The key properties of phosphors include quantum yield, stability and lifetime. In particular for LEDs the efficiency of conversion of high energy blue excitation light to the white light is a key factor for the overall LED efficiency. Phosphors are an integral part of any LED, and unfortunately contribute significantly to efficiency losses. The loss mechanisms include fundamental losses innate to the phosphor conversion material (nonradiative decay paths that lead to reduced quantum yields) and reduced extraction efficiency. The reductions in extraction efficiency include radial emission from the phosphor and wave guiding at interfaces. Phosphors are often applied in an epoxy layer over the high energy emitting GaN light source. If smooth layers are applied, effective wave guiding can occur that channels light to the sides of the device. Efforts have been made to reduce this effect through surface roughening but extraction efficiencies remain at or near 60% in the best cases. Typically phosphors are only available as powders or as thin film coatings.

One of the major obstacles in the development of high efficiency systems is loss due to wave guiding when thin film phosphors are used. Thin films help to minimize losses from self absorption, but the planar interface between the phosphor layer and other layers in the device lead to interfaces with different refractive indexes. At these interfaces all light from the phosphor that hits the interface at an angle greater than the critical angle as defined by Snell's Law is effectively reflected at the surface and wave guided to the edges of the film. One way to avoid this problem is to place the phosphor as a thin film on a three dimensional structure with vertical structures that allow the light to propagate in the desired direction. As the surface area of the 3-dimensional structure increases, more phosphor can be excited resulting in higher light yield. Porous structures offer great potential, but they are very difficult to coat. Two potential substrates include porous anodiscs that consist of a honeycomb structure with straight channels having pore diameters from 20 to 200 nm, and a second structure is posed on porous inverse opal structures having well defined connected cavities that can be readily controlled to the hundreds of nanometers, up to 500 nm. Both of these structures have high surface areas but the nanometer scale porosity with openings or cavities less than 900 nm make them very difficult to coat by traditional line-of-site techniques. More complex structures include mesoporous silica, such as Mobile Crystalline Materials ("MCMs") which possess to some degree of ordered arrays of non intersecting hexagonal channels with the pore diameter of these materials within mesoporous range between 1 to 20 nm. Porous structures of this invention, therefore include pores in a range of from 1 to 500 nm.

Over the past 10 years, photonic crystal ("PC") structures have emerged as perhaps the ultimate platform for microdevices that can manipulate light in all three dimensions. These artificial microstructures consist of a periodic repetition of dielectric elements, which creates forbidden and allowed energy bands for photons. PCs represent a major new frontier in optoelectronics due to their ability to coherently manipulate light. This manipulation is essential for enabling new concepts such as producing negative indices of refraction, tailoring the photonic density of states, controlling spontaneous emission rates, and modifying and controlling blackbody radiation. It has been predicted [Shanhui Fan, et al., Phys. Rev. Lett. 78, 3294 (1997)] that a weakly penetrating etched photonic lattice on the surface of an LED can suppress all lateral modes, causing the light to be emitted primarily in the vertical direction.

Photonic crystal ("PC") structures have emerged as perhaps the ultimate platform for micro-devices that can manipulate light in all three dimensions. PCs represent a major new frontier for a diverse set of properties including their ability to coherently manipulate light. It has been predicted that a weakly penetrating etched photonic lattice on the surface of an LED can suppress all lateral modes, causing the light to be emitted primarily in the vertical direction. PCs have been restricted to a subset of materials that can be formed in the sol-gel processing. It is not possible to make PCs from just any material, which limits their potential properties. Coating is one way to add functionality, but traditional techniques Pulsed laser deposition ("PLD") and Chemical Vapor Deposition ("CVD") cannot coat the complex porous structures. Sol-gel can penetrate the pores but does not result in conformal coatings since metal oxide oligomers form in the bulk solution. The primary technique used for effective coating of 3-D materials such as inverse opal structures is Atomic Layer Deposition ("ALD"). ALD is limited in that thicker coatings require many steps and only single component coatings can be readily applied. Polymer-Assisted Deposition ("PAD") can deposit conformal coatings of complex metal oxides on nano-structured 3-D supports. This ability to form conformal coatings has led to the formation of completely new compositions of coated mesoporous silicon (silica) that emit light. Light emission from mesoporous silicon has been reported previously but never from conformally-coated materials.

A scintillator is a material that is transparent in the scintillation or emission wavelength range and that responds to incident radiation by emitting a light pulse. From such materials, generally single crystals, it is possible to manufacture detectors in which the light emitted by the crystal that the detector comprises is coupled to a light-detection means and produces an electrical signal proportional to the number of light pulses received and to their intensity. Such detectors are used especially in industry for thickness or weight measurements and in the fields of nuclear medicine, physics, chemistry and oil exploration. A family of known scintillator crystals widely used is of the thallium-doped sodium iodide Tl:NaI type. This scintillating material, discovered in 1948 by Robert Hofstadter and which forms the basis of modern scintillators, still remains the predominant material in this field in spite of almost 50 years of research on other materials. However, these crystals have a scintillation decay which is not very fast. A material that is also used is CsI that, depending on the applications, may be used pure or doped either with thallium ("Tl") or with sodium ("Na"). One family of scintillator crystals that has undergone considerable development is of the bismuth germanate ("BGO") type. The crystals of the BGO family have high decay time constants, which limit the use of these crystals to low count rates. A more recent family of scintillator crystals was developed in the 1990s and is of the cerium-activated lutetium oxyorthosilicate Ce:LSO type. However these crystals are very heterogeneous and have very high melting points (about 2200 degrees Celsius). The development of new scintillating materials for improved performance is the subject of many studies. One of the parameters that it is desired to improve is the energy resolution. This is because in the majority of nuclear detector applications, good energy resolution is desired. The energy resolution of a nuclear radiation detector actually determines its ability to separate radiation energies which are very close. It is usually determined for a given detector at a given energy, such as the width at mid-height of the peak in question on an energy spectrum obtained from this detector, in relation to the energy at the centroid of the peak. The smaller the value of the energy resolution, the better the quality of the detector.

Nevertheless, lower values of resolution are of great benefit. For example, in the case of a detector used to analyze various radioactive isotopes, improved energy resolution enables improved discrimination of these isotopes. While thin film scintillators have limited utility in applications where energy resolution is needed in radiation detection, they have major applications in imaging systems such as X-ray imaging device.

X-ray imaging devices in which the scintillator for converting an X-ray into visible light, or the like, and the imaging devices for receiving the visible light, or the like, are used in combination and more particularly a resolution-variable X-ray imaging device whose resolution can be changed as occasion demands and an X-ray CT apparatus. As the X-ray imaging device for capturing an image by visualizing an X-ray, there are some devices that can sense directly an X-ray and others that can visualize an X-ray by using the scintillator and then capture an image by using the imaging device such as CCD, or the like. In this case high quantum yield and very short lifetimes are desirable.

Conventional neutron detectors typically include devices that operate as ionization chambers or proportional counters. Each of the available methods demonstrates different strengths, but all share the common goals of high neutron efficiency, minimum gamma-ray sensitivity or gamma/neutron discrimination. Other systems, including scintillators doped with $^6$Li, or $^{10}$B, have been examined with mixed results. One of the prime difficulties in these systems is the gamma-ray rejection characteristics of the system. In addition, many of the detector materials are air and water sensitive or the scintillators employ heavy elements that limit gamma-ray rejection or have slow response times thanks to the long relaxation times. Scintillators have the added complication that often single crystals are required to avoid light loss, making it difficult to add large amounts of boron or lithium to increase the neutron cross-section absorption. While there are obvious advantages to the use of solid-state neutron detectors, to date these are outweighed by their disadvantages. Coating scintillators onto three dimensional structures which can then be filled with neutron stooping material may provide a new class of neutron detector.

Yttrium orthovanadate ("$YVO_4$") is an excellent polarizer and laser host material in its single-crystal form. Europium doping of $YVO_4$ results in a red phosphor used in cathode ray tubes and color television in its powdered form. Europium-doped $YVO_4$ thin films have been prepared through a variety of deposition techniques such as sol-gel process, CVD, PLD and microwave-assisted chemical solution deposition. $YVO_4$ films prepared with these methods suffer from lack of crystallographic orientation control and the incorporation of vanadium-poor or rich nonstoichiometric phases.

Preparation of thin film scintillators is a difficult process. Generally, scintillators have a complex chemical composition and many methods to prepare high quality thin films are based upon high vacuum techniques.

Chemical solution deposition techniques have been generally viewed as less capital intensive (see, Lange, "Chemical Solution Routes to Single-Crystal Thin Films", Science, vol. 273, pp. 903-909, 1996 and Schwartz, "Chemical Solution Deposition of Perovskite Thin Films", Chemistry of Materials, vol. 9, pp. 2325-2340, 1997). Also, chemical solution techniques are not generally limited to flat surfaces.

SUMMARY OF THE INVENTION

To achieve the foregoing and other objects, and in accordance with the purposes of the present invention, as embodied and broadly described herein, the present invention provides a porous light-emitting composition having a porous structure having pores, an interior surface, and an exterior surface, and a film of a phosphor that coats said interior and exterior surfaces of said porous structure without substantially blocking the pores of said porous structure.

The invention also includes a porous light-emitting composition having a nanostructured support, a conformal coating of a high refractive index material on said nanostructured support, and a phosphor coating on the conformal coating.

The invention includes new porous light-emitting compositions that are phosphors on three dimensional substrates, and new phosphors based upon coated porous structures. The coated porous structure maintains porosity which may be filled with a liquid, gel, or solid. Filling the cavities with materials of refractive index that match the substrates refractive index can lead to enhanced light output for thick devices such as scintillator based radiation detectors.

DETAILED DESCRIPTION

Figure 1:
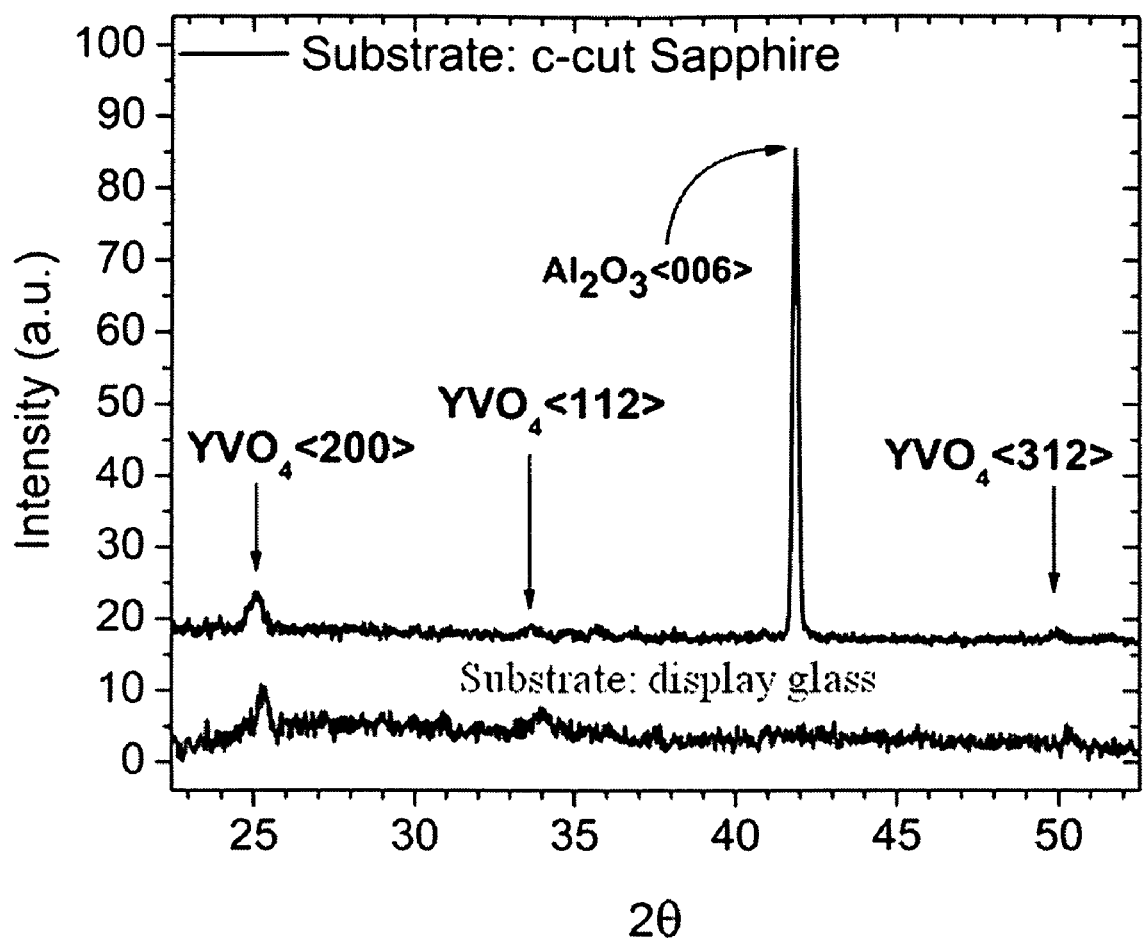
FIG. 1 shows a plot of an x-ray diffraction ("XRD") of Eu-doped $YVO_4$ on display glass and c-cut sapphire.

The present invention provides new porous light emitting compositions that include conformal films on porous substrates. The structure of the conformal film can be amorphous, composite, polycrystalline, nanocrystalline, or microcrystalline depending upon the chemistry of the solution, the substrate used for the film deposition and growth, and the post-thermal treatment conditions.

An aspect of the present invention involves the use of Polymer-Assisted Deposition ("PAD"), which employs a coating solution made by adding a metal precursor to a suitable polymer. The polymer actively binds the metal, encapsulating it to prevent chemical reactions that may lead to undesired phases of metal oxide. PAD is a low-cost chemical solution method and effectively eliminates problems such as uneven distribution of the metal oxide on the substrate, unwanted reactivity of the metal resulting in the formation of undesired phases, and the difficulty of obtaining the desired metal/metal ratios when coating a substrate with more than one metal oxide. The PAD technique is a bottom-up growth technique that enables coating complex 3-D structures.

It has been found that the metal-containing conformal films made in accordance with the present invention can be uniform throughout the porous structure and without clogging or filling the pores of the porous structure. This is in contrast to various prior techniques that often result in non-uniform coating, or incomplete complete coating of the porous structure or clogging or significant reduction of the surface area of the final nanocomposite. The application of this technique on nanostructured supports provides new light emitting materials.

Metal-containing films (the metal oxide, metal, the nitride and the like) of the present invention are conformal films, i.e., they are homogeneous films throughout the internal pores of the porous supports that do not greatly reduce the surface area by clogging pore openings.

Phosphors are often complex mixtures such as europium-doped yttrium vanadate or lanthanide-doped silicates that may include metals from more than one category. The conformal metal-containing films prepared by the present process can include a metal oxide with a single metal, can be a metal oxide with two metals or three metals or may be a metal oxide including four or more metals. Among the conformal metal oxides films that can be prepared by the present process are phosphor films including europium-doped yttrium vanadate, terbium-doped alumina, and the like.

Metal-containing films that can be prepared by the present process can include a metal-containing film with a single metal, can be a metal containing film with two metals or three metals or may be a metal containing film including four or more metals. Among the metal oxide phosphors that can be prepared by the present process are included europium doped yttrium vanadate, terbium-doped alumina and the like.

In one aspect of the present invention, composites can be prepared including with various additional additives to provide tailoring of the material properties. Among the additives can be nanoparticles, especially nanoparticles of various metals such as transition metals, lanthanide metals or main group metals, nanoparticles of various metal oxides including one or more metal such as a transition metal, a lanthanide metal or a main group metal, nanoparticles of various metal nitrides including one or more metal such as a transition metal, a lanthanide metal or a main group metal, nanoparticles of various metal carbides including one or more metal such as a transition metal, a lanthanide metal or a main group metal, nanoparticles of various metal chalcogenides including one or more metal such as a transition metal, a lanthanide metal or a main group metal, nanoparticles of various metal pnictogenides including one or more metal such as a transition metal, a lanthanide metal or a main group metal, nanoparticles of various metal borides including one or more metal such as a transition metal, a lanthanide metal or a main group metal, or nanoparticles of various metal silicides including one or more metal such as a transition metal, a lanthanide metal or a main group metal. Examples of such nanoparticles can include titanium dioxide, strontium oxide, erbium oxide and the like, such nanoparticles suitable for modifying the electronic properties of metal containing films of a different material.

Also, various quantum dot materials, e.g., cadmium selenide dots having a coating of zinc sulfide, such quantum dot materials being well known to those skilled in the art, may be added to the various metal containing films in accordance with the present invention.

In one embodiment of the present invention, the porous substrate can be an inverse opal structure based on an oxide framework. The oxide framework can consist of silica, borate, zirconium oxide, titanium oxide, and the like. The size of the cavities of the support framework can be varied from hundreds of microns down to tens of nanometers.

In one embodiment of the present invention, the porous substrate can be a porous alumina membrane. The size of the pores can be varied from microns down to nanometers.

In one embodiment of the present invention, the porous substrate can be a mesoporous silica structure. The size of the pores can be varied from microns down to 1 nanometer.

In one embodiment of the present invention, the porous substrate can be a mesoporous silica structure coated with simple metal oxides, not generally consider phosphors, that result in a new material that emits light. The size of the pores can be varied from microns down to 1 nanometer.

In one embodiment of the present invention, the resulting porous structure with the metal-containing coating from the PAD deposition may be subsequently filled with a liquid, gel or solid. The conformal coating does not fill the pore volume so that the pores may be filled with a subsequent step to add functionality including high Z materials for gamma-ray absorption, boron-containing materials for neutron absorption, materials with a refractive index to match the substrate in order to increase the light output of the phosphor and the like.

In one embodiment of the present invention, the nanoporous substrate can be coated first with a high refractive index material then a second layer of a phosphor can be added.

In one embodiment of the present invention, the nanoporous substrate can be coated first with a high refractive index material then multiple layers of phosphors can be added.

The post-thermal treatment conditions such as post-annealing temperature and ambient change in a wide range depending on the objectives of the materials deposited. For example, to grow oxide films of europium doped yttrium vanadate on porous alumina membranes or silica inverse opals, the temperature can be ramped up to 120° C. at 10°/min and held for 1 hour and then ramped the temperature to 450° C. at 10°/min and held for 1 hour to burn off the polymer. Finally the temperature can be ramped to 700° C. at 10°/min and held for 1 hour to cause a crystalline structure and enhance the luminescence of the phosphor.

Aqueous solutions containing polyethylenimine ("PEI") bound to single metal ethylenediaminetetraaceticacid ("EDTA") complexes were prepared, characterized by ICP and mixed to give the final solutions for coating. Thin films on display glass and quartz were prepared by spin coating and coatings on Anodisc® membrane filters were prepared by a dip coating method that allowed the solution to penetrate the pores of the alumina. The coated substrates were then thermally treated up to a temperature of 700° C. to induce crystallization of the $Eu:YVO_4$. The resulting film composition, determined by Rutherford backscattering spectrometry ("RBS"), of $Y_{0.94}V_{1.00}Eu_{0.08}S_{0.06}$ confirms the europium doping level and indicates the presence of residual sulfate from the vanadyl sulfate precursor used in preparing the vanadium solution. XRD of the films (FIG. 1) shows only the expected peaks for $YVO_4$. The fluorescence results (FIG. 2) show strong red emission (for films with only 2 coats) from the $^5D_0 \rightarrow ^7F_2$ transition of europium at 618 nm indicating the europium is in a low symmetry environment as expected. There is no indication of phase separation in the films.

Ellipsometry results indicated film thickness of 152.3±2.5 nm for the 4 coats of Eu:$YVO_4$ on glass and 87.2±0.2 nm for the 2 coats of Eu:$YVO_4$ on c-cut sapphire with a roughness of 6.2±0.1 nm. Each single coat yields a film thickness of approximately 40 nm. AFM measurements gave MSR roughness values of 1.3 nm for the bare glass substrate, 6.0 nm for the Eu:$YVO_4$ film on glass and 4.1 nm for the Eu:$YVO_4$ film on c-cut sapphire. These MSR roughness values are as low as those obtained by PLD. This is astonishing considering the initial thermal process involves simply placing a spin coated substrate onto a hot surface at 550° C. for 30 seconds. During this time, water from the film is evaporated and the polymer is removed resulting in a remarkably clear, smooth film with no cracks.

Figure 2:
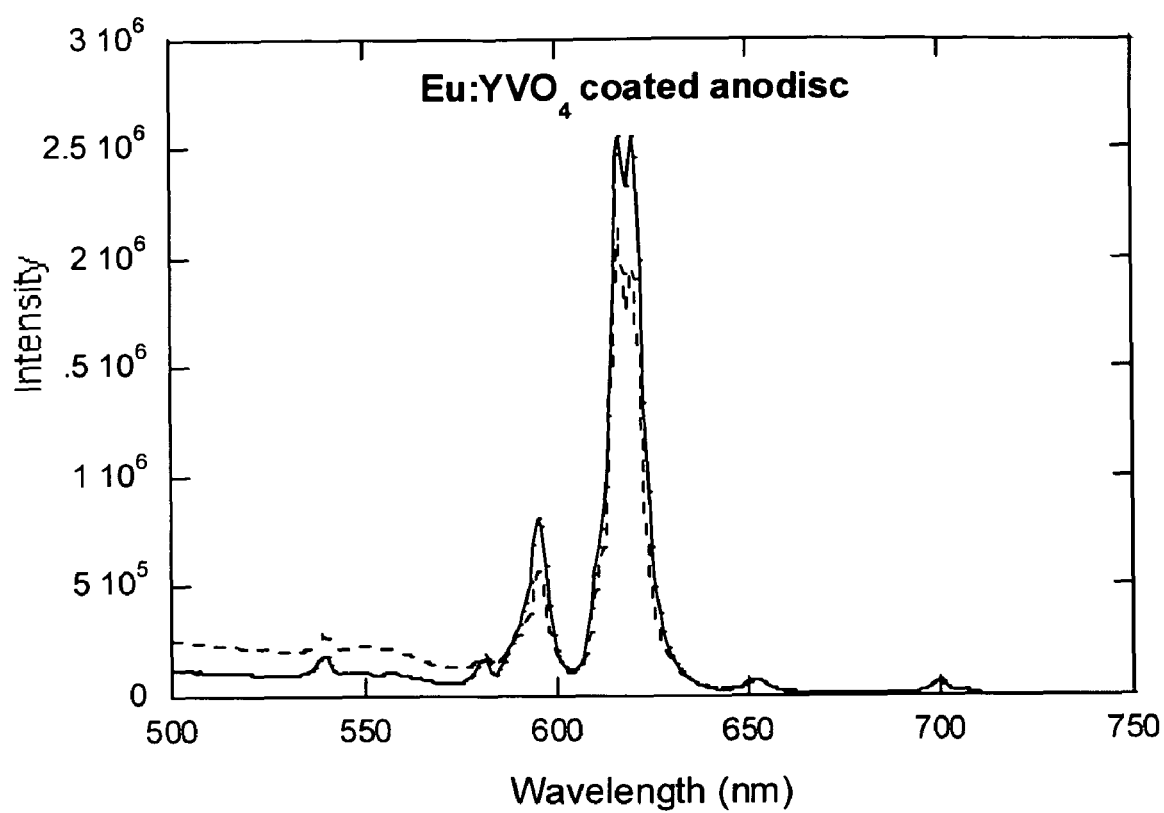
FIG. 2 shows a plot of an emission spectrum (excitation at 280 nm) of Eu $YVO_4$ on display glass (2 coats; dashed line) and Anodisc® filter (1 coat; solid line).
Figure 3:
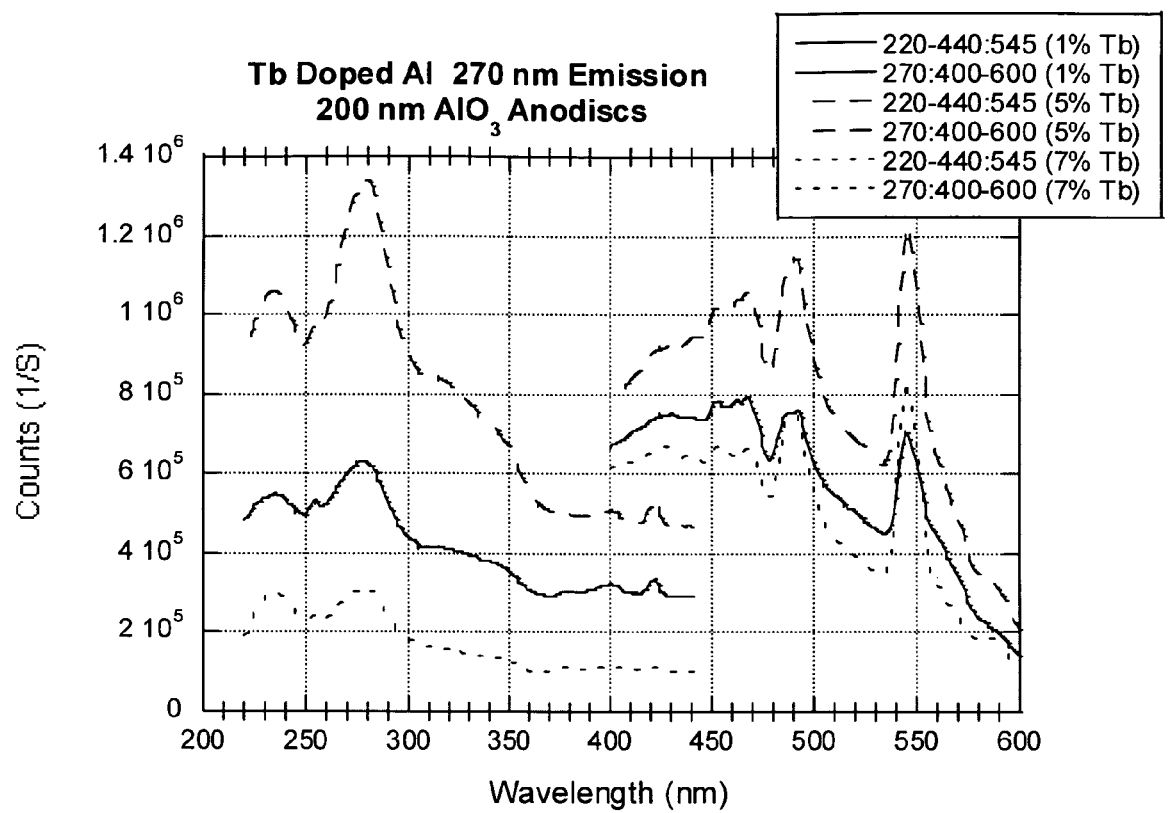
FIG. 3 shows a selection excitation and emission spectra of Tb doped alumina on an Anodisc® filter at varying Tb concentrations.

Unlike many other deposition techniques, PAD is not a line-of-sight process. It is a solution technique that can coat all aspects of a surface. We chose to demonstrate the ability to coat deep narrow channels using the commercially available Anodisc® membrane filters made from Anapore® porous membranes. The membranes are initially 60 μm thick with a closely packed honeycomb of 200 nm diameter channels through the membrane. The pores in the membrane are not periodically arranged into a photonic lattice, but they have the same general dimensions used in photonic crystals. The solution readily wets into the pores by capillary action. The resulting materials have phosphor throughout the channels, and maintain porosity. Scanning Electron Microscopy ("SEM") confirms the open pore structure. The porosity is further demonstrated by the fact that water is able to wet into and through the coated Anodisc® membrane filters resulting in high transparency. Other solution techniques such as sol-gel clog and fill pores as opposed to depositing conformal coatings. Anodisc® membrane filters with a single coating show the strong europium emission (FIG. 2). These coated porous discs are highly luminescent and appear much brighter than the thin films on display glass. Part of this increased luminescence comes from reduced wave guiding on the porous material. Wave guiding at the surface interface in the thin films leads to strong luminescence at the edges but prevents light from exiting the surface when it hits the surface at an angles>the critical angle as defined by Snell's Law. Other effects such as increased absorption as the excitation light interacts with the walls of the channels and increased surface area may also factor in the remarkable emission.

Figure 4:
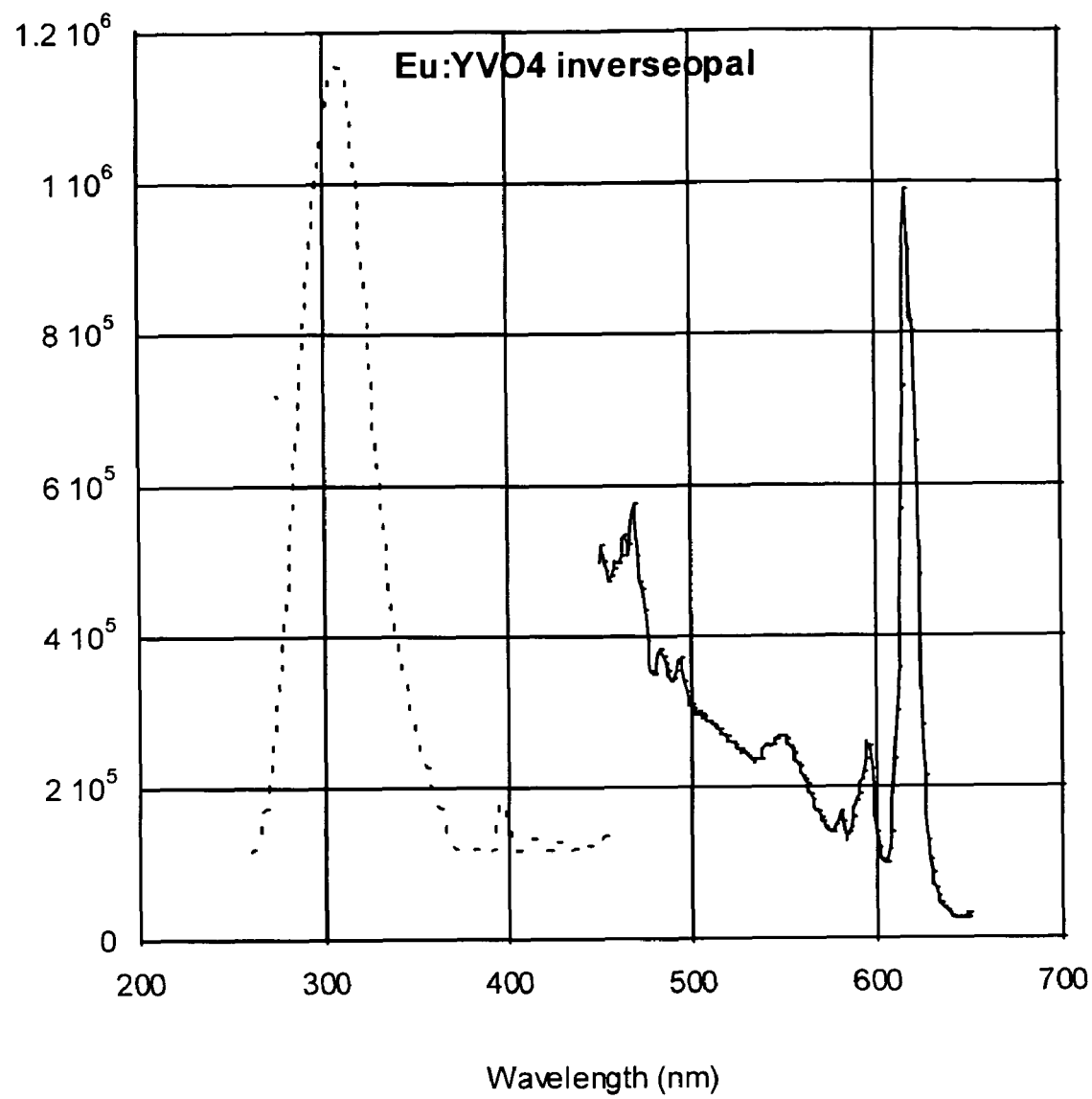
FIG. 4 shows a plot of an emission spectrum (excitation at 300 nm) of Anodisc® filter with one coat of Eu:$YVO_4$ dry (solid) and wetted (dashed).

Excitation and emission spectra were recorded for Eu:$YVO_4$ thin films coated on display glass. The sharp emission of europium is readily observed with 2 coats of Eu:$YVO_4$ on c-cut sapphire and one cat on a porous Anodisc® membrane filters (FIG. 2). The excitation spectra of all of the coated materials have a peak at <300 nm that corresponds to the absorption of vanadate. The Anodisc® membrane filters were given a single coating of Eu:$YVO_4$. The discs emit both dry and wet. Strong emission is observed from a completely wetted disc suggesting that surface quenching of the europium is not significant and refractive index matching helps limit scattering. FIG. 4 shows excitation emission spectra from coating another phosphor Tb doped alumina onto the Anodisc® membrane filters.

Coating onto inverse opals with 360 nm diameter cavities is also possible with high refractive index metal oxides (for example, coating of the silica-based inverse opals with zirconium oxide). Surface area measurements and SEMs confirm that the coating is conformal with open pores that maintain the high surface area.

Coating onto titanium-based inverse opals with 360 nm diameter cavities is also possible with high refractive index metal oxides (for example coating of the titanium-based inverse opals with zirconium oxide). Surface area measurements and SEMs confirm that the coating is conformal with open pores that maintain the high surface area.

Figure 5:
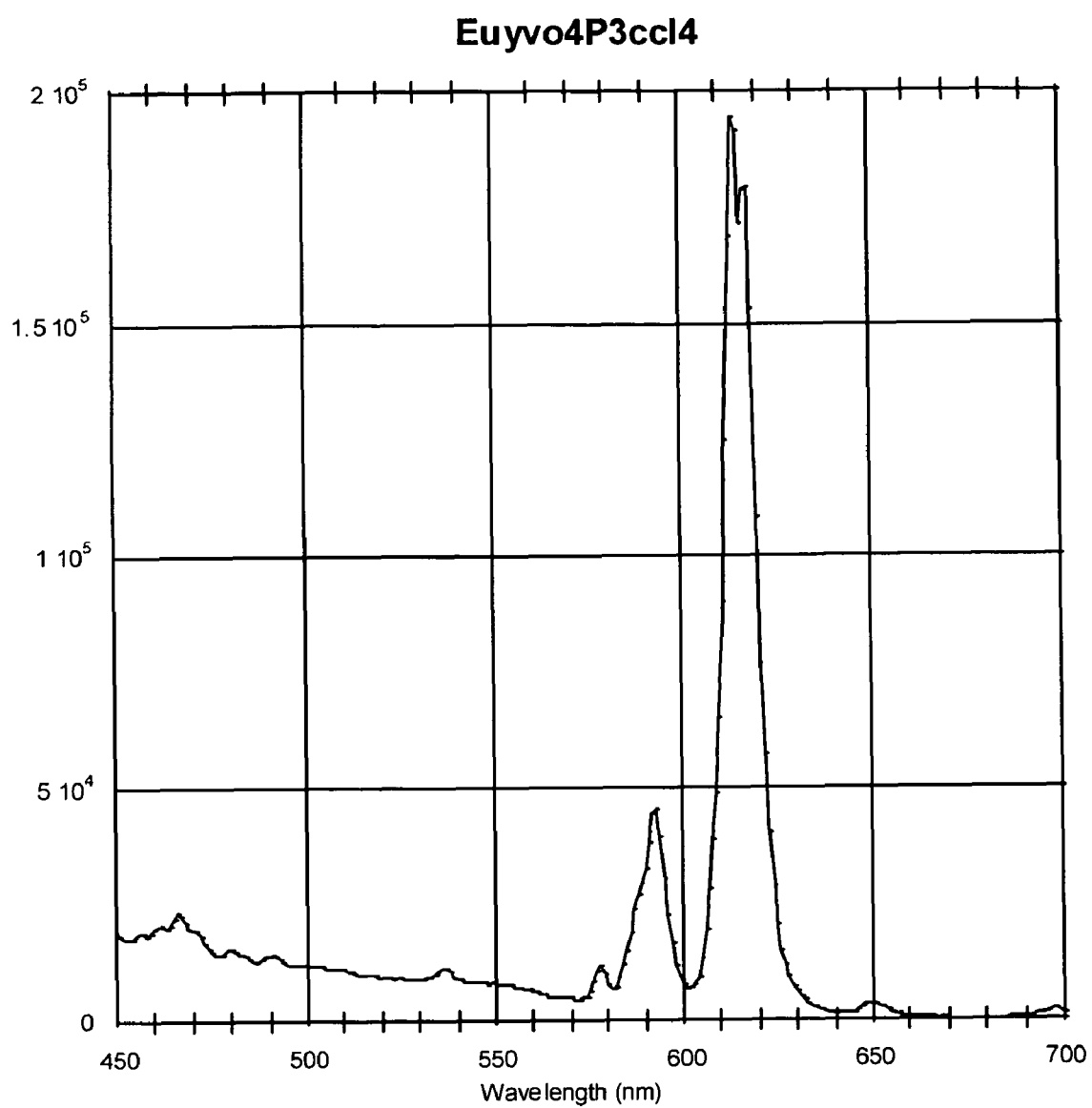
FIG. 5 shows emission spectra of Eu:$YVO_4$ coated silica inverse opal filled with $CCl_4$ in the cavities.

Coating onto silica-based inverse opals with 360 nm diameter cavities was successful. FIG. 4 shows the fluorescence spectrum of Eu:$YVO_4$ coated onto the inverse opal structure. Surface area measurements and SEMs confirm that the coating is conformal with open pores that maintain the high surface area. These cavities can then be filled with $CCl_4$ which reduces the light scattering at the interfaces and maintains the strong emission seen in FIG. 5.

Coating onto mesoporous silica (MCM-41) was also successful. Surface area measurements and SEMs confirm that the coating is conformal and the mesoporous silica still contains open pores that maintain the high surface area.

The present invention is more particularly described in the following EXAMPLES, which are intended as illustrative only, since numerous modifications and variations will be apparent to those skilled in the art.

Example A describes the preparation of solutions used in the deposition and formation of the metal-containing conformal films. Examples B through F describe the deposition of such conformal metal-containing films on porous supports. Polyethylenimine ("PEI") was obtained from BASF as a water-free, branched, polymer with an average MW of 50,000. Water was deionized via reverse osmosis (having a resistivity >16 MOhms) ("MΩ").

Example A

Solutions

A yttrium solution was prepared by mixing 1.3 g yttrium nitrate hexahydrate (99.9%, ALFA AESAR) with 1.0 g HEDTA (ALDRICH, 99.995% pure) and 1.0 g BASF polyethyleneimine polymer. The resulting solution was filtered through a 0.45 micron filter, diluted to 200 mL with nano pure water, and purified by Amicon filtration with a 3,000 MW cut-off filter. The final concentrated solution was 133 mM yttrium, determined by ICP/AES.

A europium solution was prepared by mixing 1.0 g of europium nitrate hexahydrate (99.9%, ACROS) with 1.0 g HEDTA (ALDRICH, 99.995% pure) and 1.0 g BASF polyethyleneimine polymer. The resulting solution was filtered through a 0.45 micron filter, diluted to 200 mL, and purified by Amicon filtration with a 3,000 MW cut-off filter. The final concentrated solution was 136 mM europium.

A vanadium solution was prepared by mixing 1.0 g vanadyl sulfate (ACROS) with 1.0 g HEDTA (ALDRICH, 99.995% pure) and 1.0 g BASF polyethyleneimine polymer. The resulting solution was filtered through a 0.45 micron filter, diluted to 200 mL, and purified by Amicon filtration with a 3,000 MW cut-off filter. The final concentrated solution was 230 mM vanadium, determined by ICP/AES.

A terbium solution was prepared by mixing 1 g terbium chloride $TbCl_3$ hexahydrate (99.9%, ACROS) with 1.0 g HEDTA (ALDRICH, 99.995% pure) and 1.0 g BASF polyethyleneimine polymer. The resulting solution was filtered through a 0.45 micron filter, diluted to 200 mL with nano pure water, and purified by Amicon filtration with a 3,000 MW cut-off filter. The final concentrated solution was 143 mM terbium, determined by ICP/AES.

An aluminum solution was prepared by mixing 2.0 g of aluminum nitrate nanohydrate (99.997%, ALDRICH) with 2.0 g HEDTA (ALDRICH, 99.995% pure) and 8.7 g of a 30% aqueous solution of polyethyleneimine polymer (POLY SCIENCES INC.). The resulting solution was filtered through a 0.45 micron filter, diluted to 200 mL, and purified by Amicon filtration with a 3,000 MW cut-off filter. The final concentrated solution was 180 mM aluminum.

A hafnium coating solution was prepared by mixing 2.0 g of $HfOCl_2$ (ALDRICH, 99.99% pure), 2.0 g HEDTA, 2 grams BASF polyethyleneimine polymer, and concentrated ammonium hydroxide ($NH_4OH$ (FISHER) in deionized (18 MOhms) $H_2O$ was added until the solution was clear. The resulting solution was filtered through a 0.45 micron filter, diluted to 200 mL with nano pure water, and purified by Amicon filtration with a 3,000 MW cut-off filter. The final concentrated solution was 163 mM Hf, determined by ICP/AES. This solution was rotovapped to further concentrate it, resulting in a final concentration of 250 mM Hf.

A titanium coating solution was prepared by mixing small aliquots of the titanium solution (a mixture of 2.5 g of 30% peroxide into 30 mL water and then slowly adding 2.5 g titanium tetrachloride) to a solution containing 1 g PEI, 1 g EDTA, and 30 mL water, while maintaining pH at 7.5, until precipitation occurred. The final Ti concentration was 408 mM.

A zirconium solution was prepared by mixing 2.04 g of zirconyl nitrate, ($ZrO(NO_3)_2$, ALDRICH, 35 wt % Zr), 2.0 g HEDTA (ALDRICH, 99.995% pure), 2 grams BASF polyethyleneimine polymer, and concentrated ammonium hydroxide ($NH_4OH$ (FISHER) in deionized (18 MOhms) $H_2O$ was added until the solution was clear. The resulting solution was filtered through a 0.45 micron filter, diluted to 200 mL with nano pure water, and purified by Amicon filtration with a 3,000 MW cut-off filter. The final concentrated solution was 225 mM Zr, determined by ICP/AES.

A solution including zinc chloride, dipotassium ethylenediaminetetraacetic acid ("$K_2EDTA$") and PEI was prepared as follows. An aqueous solution of 2.0 grams of dipotassium ethylenediaminetetraacetic acid in 30 mL of water was prepared. To this solution was added 0.75 grams of zinc chloride and the solution was stirred. After stirring, 2 grams of polyethyleneimine were added and the pH was adjusted to 9 with addition of 10% HCl. The solution was placed in an Amicon ultrafiltration unit containing a PM 10 ultrafiltration membrane designed to pass materials having a molecular weight <10,000 g/mol. The solution was diluted to 200 mL, and then concentrated by ultrafiltration to 20 mL in volume. Inductively coupled plasma-atomic emission spectroscopy showed that the final solution had 24.2 mg/mL of Zn.

Example B

P1-Photonic Crystals with one coat of YV/5% Eu were prepared as follows. $SiO_2$ crystals were coated with YV/5% Eu using the PAD method of coating. Coating solutions were made by mixing calculated volumes of each solution to obtain a 1:1 mol ratio of Y to V. A calculated volume of Eu solution was added to the Y/V solution to obtain a 5% mol ratio of Eu. 283 mg of the solution was then dropped onto 32 mg of P1 photonic crystals in a 20-mL scintillation vial. The vial was rotated to ensure total coverage of the crystals by the coating solution. The coated crystals were then rotovapped under negative pressure in order to cause the solution to penetrate the cavities within the photonic crystals and remove excess water. When the crystals appeared dry, the crystals were transferred to a ceramic crucible. The crystals were then annealed in air with the following heating program: The temperature was ramped to 120° C. at 10°/min and held for 1 hour. The temperature was ramped to 450° C. at 10°/min and held for 1 hour. The temperature was ramped to 700° C. at 10°/min and held for 1 hour.

Example C

P1-Photonic Crystals with two coats of YV/5% Eu were prepared as follows. $SiO_2$ crystals were coated with YV/5% Eu using the PAD method of coating. Coating solutions were made by mixing calculated volumes of each solution to obtain a 1:1 mol ratio of Y to V. A calculated volume of Eu solution was added to the Y/V solution to obtain a 5% mol ratio of Eu. 194 mg of the solution was then dropped onto 32 mg of P1 photonic crystals in a 20-mL scintillation vial. The vial was rotated to ensure total coverage of the crystals by the coating solution. The coated crystals were then rotovapped under negative pressure in order to cause the solution to penetrate the cavities within the photonic crystals and remove excess water. When the crystals appeared dry, the crystals were transferred to a ceramic crucible. The crystals were then annealed in air with the following heating program: The temperature was ramped to 120° C. at 10°/min and held for 1 hour. The temperature was ramped to 450° C. at 10°/min and held for 1 hour. The temperature was ramped to 700° C., 10°/min and held for 1 hour. The crystals were removed from the crucible and placed in a scintillation vial. Another 245 mg of YV/5% Eu solution were dropped onto the crystals with 1 coat of YV/5% Eu. The vial was rotated to ensure total coverage of the crystals by the coating solution. The coated crystals were then rotovapped under negative pressure in order to cause the solution to penetrate the cavities within the photonic crystals and remove excess water. When the crystals appeared dry, the crystals were transferred to a ceramic crucible. The crystals were then annealed in air with the following heating program: The temperature was ramped to 120° C., 10°/min and held for 1 hour. The temperature was ramped to 450° C. at 10°/min and held for 1 hour. The temperature was ramped to 700° C. at 10°/min and held for 1 hour.

Example D

P3-Photonic Crystals with one coat of YV/5% Eu were prepared as follows. $SiO_2$ crystals were coated with YV/5% Eu using the PAD method of coating. Coating solutions were made by mixing calculated volumes of each solution to obtain a 1:1 mol ratio of Y to V. A calculated volume of Eu solution was added to the Y/V solution to obtain a 5% mol ratio of Eu. 228 mg of the solution was then dropped onto 32 mg of P3 photonic crystals in a 20-mL scintillation vial. The vial was rotated to ensure total coverage of the crystals by the coating solution. The coated crystals were then rotovapped under negative pressure in order to cause the solution to penetrate the cavities within the photonic crystals and remove excess water. When the crystals appeared dry, the crystals were transferred to a ceramic crucible. The crystals were then annealed in air with the following heating program: The temperature was ramped to 120° C. at 10°/min and held for 1 hour. The temperature was ramped to 450° C. at 10°/min and held for 1 hour. The temperature was ramped to 700° C. at 10°/min and held for 1 hour.

Example E

Alumina anodiscs coated with 1 coat YV/5% Eu were prepared as follows. Anodisc porous alumina membranes were coated with a YV/5% Eu solution using the PAD method of coating. The membranes coated were 60 μm thick with a closely packed honeycomb of 200 nm diameter channels through the membrane. Membranes were wetted with the a coating solution made up of a 1:1 ratio of Y:V and 5% Eu. Coating solutions were made by mixing calculated volumes of each solution to obtain a 1:1 mol ratio of Y to V. A calculated volume of Eu solution was added to the Y/V solution to obtain a 5% mol ratio of Eu. A 60 μL volume of solution was placed on a glass slide, and the Anodisc® membrane filters were wetted with the solution by sliding them through the solution on the slide. The Anodisc® membrane filters were then placed on upside down ceramic crucibles and fired in a furnace in air with the following program: The temperature was ramped to 120° C. at 10°/min and held for 1 hour. The temperature was ramped to 450° C. at 10°/min and held for 1 hour. The temperature was ramped to 700° C. at 10°/min and held for 1 hour.

Example F

Alumina anodiscs coated with 1 coat Tb doped Aluminum were prepared as follows. Anodisc porous alumina membranes were coated with an aluminum solution doped with 1%, 3%, 5%, 7%, and 10% Tb using the PAD method of coating. The membranes coated were 60 μm thick with a closely packed honeycomb of 200 nm diameter channels through the membrane. Coating solutions were made by mixing calculated volumes of each solution to obtain a 1%, 3%, 5%, 7%, and 10% mol ratio of Tb. A 60 μL volume of solution was placed on a glass slide, and the Anodisc® membrane filters were wetted with the solution by sliding them through the solution on the slide. The Anodisc® membrane filters were then placed on upside down ceramic crucibles and fired in a furnace in air with the following program: The temperature was ramped to 120° C., 10°/min and held for 1 hour. The temperature was ramped to 450° C. at 10°/min and held for 1 hour. The temperature was ramped to 700° C. at 10°/min and held for 1 hour.

Example G

P3-Photonic Crystals with one coat of YV/5% Eu were prepared as follows. TiO$_2$ crystals were coated with YV/5% Eu using the PAD method of coating. Coating solutions were made by mixing calculated volumes of each solution to obtain a 1:1 mol ratio of Y to V. A calculated volume of Eu solution was added to the Y/V solution to obtain a 5% mol ratio of Eu. 228 mg of the solution was then dropped onto 32 mg of photonic crystals in a 20-mL scintillation vial. The vial was rotated to ensure total coverage of the crystals by the coating solution. The coated crystals were then rotovapped under negative pressure in order to cause the solution to penetrate the cavities within the photonic crystals and remove excess water. When the crystals appeared dry, the crystals were transferred to a ceramic crucible. The crystals were then annealed in air with the following heating program: The temperature was ramped to 120° C. at 10°/min and held for 1 hour. The temperature was ramped to 450° C. at 10°/min and held for 1 hour. The temperature was ramped to 700° C. at 10°/min and held for 1 hour.

Example H

Titania photonic crystals with one coat of YV/5% Eu were prepared as follows. TiO$_2$ crystals were coated with YV/5% Eu using the PAD method of coating. Coating solutions were made by mixing calculated volumes of each solution to obtain a 1:1 mol ratio of Y to V. A calculated volume of Eu solution was added to the Y/V solution to obtain a 5% mol ratio of Eu. 228 mg of the solution was then dropped onto 32 mg of P3 photonic crystals in a 20-mL scintillation vial. The vial was rotated to ensure total coverage of the crystals by the coating solution. The coated crystals were then rotovapped under negative pressure in order to cause the solution to penetrate the cavities within the photonic crystals and remove excess water. When the crystals appeared dry, the crystals were transferred to a ceramic crucible. The crystals were then annealed in air with the following heating program: The temperature was ramped to 120° C. at 10°/min and held for 1 hour. The temperature was ramped to 450° C. at 10°/min and held for 1 hour. The temperature was ramped to 700° C. at 10°/min and held for 1 hour.

Example I

The zirconium-coated inverse opals were prepared by diluting 192 mg of the zirconium solution with 107 mg of deionized (18 MΩ) H$_2$O. The solution was then dropped onto 32 mg of titanium oxide photonic crystals in a 20-mL scintillation vial. The vial was rotated to ensure total coverage of the crystals by the coating solution. The coated crystals were then rotovapped under negative pressure in order to cause the solution to penetrate the cavities within the photonic crystals and remove excess water. When the crystals appeared dry, the crystals were transferred to a ceramic crucible. The crystals were then annealed in air with the following heating program: The temperature was ramped to 120° C. at 10°/min and held for 1 hour. The temperature was ramped to 450° C. at 10°/min and held for 1 hour. The temperature was ramped to 500° C. at 10°/min and held for 1 hour.

Example J

The hafnium-coated inverse opals were prepared by taking 200 mg of the hafnium solution and diluting with 100 mg of deionized (18 MΩ) H$_2$O. The solution was then dropped onto 32 mg of the titanium dioxide photonic crystals in a 20-mL scintillation vial. The vial was rotated to ensure total coverage of the crystals by the coating solution. The coated crystals were then rotovapped under negative pressure in order to cause the solution to penetrate the cavities within the photonic crystals and remove excess water. When the crystals appeared dry, the crystals were transferred to a ceramic crucible. The crystals were then annealed in air with the following heating program: The temperature was ramped to 120° C., 10°/min and held for 1 hour. The temperature was ramped to 450° C., 10°/min and held for 1 hour. The temperature was ramped to 500° C., 10°/min and held for 1 hour.

Example K

The titanium-coated inverse opals were prepared by taking 200 mg of the titanium solution and diluting with 100 mg of deionized (18 MΩ) H$_2$O. The solution was then dropped onto 32 mg of the titanium oxide photonic crystals in a 20-mL scintillation vial. The vial was rotated to ensure total coverage of the crystals by the coating solution. The coated crystals were then rotovapped under negative pressure in order to cause the solution to penetrate the cavities within the photonic crystals and remove excess water. When the crystals appeared dry, the crystals were transferred to a ceramic crucible. The crystals were then annealed in air with the following heating program: The temperature was ramped to 120° C. at 10°/min and held for 1 hour. The temperature was ramped to 450° C., 10°/min and held for 1 hour. The temperature was ramped to 500° C., 10°/min and held for 1 hour.

Example L

A first layer of hafnium was coated onto an inverse opal by taking 200 mg of the hafnium solution and diluting with 100 mg of deionized (18 MΩ) $H_2O$. The solution was then dropped onto 32 mg of the titanium dioxide photonic crystals in a 20-mL scintillation vial. The vial was rotated to ensure total coverage of the crystals by the coating solution. The coated crystals were then rotovapped under negative pressure in order to cause the solution to penetrate the cavities within the photonic crystals and remove excess water. When the crystals appeared dry, the crystals were transferred to a ceramic crucible. The crystals were then annealed in air with the following heating program: The temperature was ramped to 120° C., 10°/min and held for 1 hour. The temperature was ramped to 450° C., 10°/min and held for 1 hour. The temperature was ramped to 500° C., 10°/min and held for 1 hour. Then this material was coated with YV/5% Eu using the PAD method of coating. Coating solutions were made by mixing calculated volumes of each solution to obtain a 1:1 mol ratio of Y to V. A calculated volume of Eu solution was added to the Y/V solution to obtain a 5% mol ratio of Eu. 228 mg of the solution was then dropped onto 32 mg of photonic crystals in a 20-mL scintillation vial. The vial was rotated to ensure total coverage of the crystals by the coating solution. The coated crystals were then rotovapped under negative pressure in order to cause the solution to penetrate the cavities within the photonic crystals and remove excess water. When the crystals appeared dry, the crystals were transferred to a ceramic crucible. The crystals were then annealed in air with the following heating program: The temperature was ramped to 120° C. at 10°/min and held for 1 hour. The temperature was ramped to 450° C. at 10°/min and held for 1 hour. The temperature was ramped to 700° C. at 10°/min and held for 1 hour.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A porous light-emitting composition, comprising:
a porous structure having pores, an interior surface, and an exterior surface, and
a film of a phosphor that coats said interior and exterior surfaces of said porous structure without substantially blocking the pores of said porous structure,
said porous structure comprising a mesoporous silicon or mesoporous silica structure,
said mesoporous silicon or mesoporous silica structure comprising an inverse opal, a photonic crystal, a mobile crystalline material (MCM) that comprises ordered arrays of nonintersecting hexagonal channels, and a porous anodisc having a honeycomb structure.

2. The porous light-emitting composition of claim 1, wherein said porous structure has pore sizes in a range of from 1 to 500 nm.

3. The porous light-emitting composition of claim 1, wherein said phosphor comprises a transition metal oxide.

4. The porous light-emitting composition of claim 1, wherein said phosphor comprises a lanthanide doped metal oxide.

5. The porous light-emitting composition of claim 1, wherein said phosphor comprises $Eu:YVO_3$, $Tb:Al_2O_3$, or a lanthanide-doped $Y_3Al_5O_{12}$.

6. The light-emitting device of claim 1, further comprising an index matching material that fills the pores of said porous structure.

* * * * *